US006677868B2

(12) United States Patent
Kerofsky et al.

(10) Patent No.: US 6,677,868 B2
(45) Date of Patent: Jan. 13, 2004

(54) ENTROPY CODING WITH ADAPTIVE SYNTAX TO REPLACE HIGH PROBABILITY SYMBOLS WITH LOWER PROBABILITIES SYMBOLS

(75) Inventors: Louis J. Kerofsky, Portland, OR (US); Shijun Sun, Vancouver, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/017,838

(22) Filed: Dec. 12, 2001

(65) Prior Publication Data

US 2002/0131506 A1 Sep. 19, 2002

Related U.S. Application Data

(60) Provisional application No. 60/278,825, filed on Mar. 16, 2001.

(51) Int. Cl.[7] .................................................. H03M 7/00
(52) U.S. Cl. ........................... 341/107; 341/51; 341/67; 341/63
(58) Field of Search ........................... 341/67, 107, 63, 341/59; 382/232

(56) References Cited

U.S. PATENT DOCUMENTS

| | | | | |
|---|---|---|---|---|
| 4,933,883 A | * | 6/1990 | Pennebaker et al. | 341/107 |
| 5,142,283 A | * | 8/1992 | Chevion et al. | 341/107 |
| 5,275,478 A | * | 1/1994 | Schmitt et al. | 303/119.2 |
| 5,363,099 A | * | 11/1994 | Allen | 341/107 |
| 5,414,423 A | * | 5/1995 | Pennebaker | 341/107 |
| 5,504,484 A | * | 4/1996 | Wilson | 341/67 |
| 5,546,080 A | * | 8/1996 | Langdon et al. | 341/107 |
| 5,946,043 A | | 8/1999 | Lee et al. | 348/420 |
| 5,999,111 A | | 12/1999 | Park et al. | 341/67 |
| 6,075,470 A | | 6/2000 | Little et al. | 341/107 |
| 6,075,471 A | * | 6/2000 | Kimura et al. | 341/107 |
| 6,081,213 A | | 6/2000 | Hosaka | 341/107 |
| 6,118,822 A | | 9/2000 | Bist | 375/240 |
| 6,188,338 B1 | * | 2/2001 | Yokose | 341/65 |
| 6,222,468 B1 | * | 4/2001 | Allen | 341/107 |
| 6,265,997 B1 | * | 7/2001 | Nomizu | 341/107 |
| 6,298,160 B1 | * | 10/2001 | Goertzen | 341/107 |
| 6,480,829 B2 | * | 11/2002 | Heo | 341/107 |
| 6,563,439 B1 | * | 5/2003 | Acharya et al. | 341/65 |
| 6,580,833 B2 | * | 6/2003 | Goertzen | 341/50 |

OTHER PUBLICATIONS de Oliveria, Juavane C., "A Java H.263 Decoder Implementation", Electrical and Computer Engineering Department, University of Ottawa, Apr. 15, 1997.
Côté et al., "H.263+: Video Coding at Low Bit Rates", *IEEE Transactions on Circuits and Systems for Video Technology*, vol. 8, No. 7, Nov. 1998.
Slide presentation for "Multimedia Networking and Communications" EE384B, Spring 2001, Professor C. Noronha, pp. 17–24 and pp. 43–46.
Dovstam, Kristofer, "Video Coding in H.26L", Master of Science Thesis for the Royal Institute of Technology, Sweden, Apr. 2000.
Erol et al., "The H.263+ Video Coding Standard: Complexity and Performance", Department of Electrical Engineering, University of British Columbia, at least as early as 1997.

* cited by examiner

*Primary Examiner*—Michael Tokar
*Assistant Examiner*—Lam T. Mai
(74) *Attorney, Agent, or Firm*—Chernoff, Vilhauer, McClung & Stenzel, LLP

(57) ABSTRACT

The compression efficiency of variable length coding is preserved by altering the syntax of a bit stream input to a variable length coder if the bit stream is likely to include a symbol with a high occurrence probability.

16 Claims, 7 Drawing Sheets

ENTROPY CODING WITH ADAPTIVE SYNTAX TO REPLACE HIGH PROBABILITY SYMBOLS WITH LOWER PROBABILITIES SYMBOLS

CROSS-REFERENCE TO RELATED APPLICATIONS

This application claims the benefit of U.S. Provisional Application No. 60/278,825, filed Mar. 16, 2001.

BACKGROUND OF THE INVENTION

The present invention relates to data compression and, more particularly, to improved entropy coding of compressed data streams.

Digital video comprises individual images or frames that are displayed in rapid succession. Digital images are typically represented as an array of data expressing the intensities of a plurality of picture elements or pixels. Each pixel is a sample of the intensity of the image at a set of coordinates defined by a rectangular grid virtually overlaying the image. The analog signal obtained by sampling the image at the spatial coordinates of a pixel is quantized to a discrete value that is proportional to the amplitude of the intensity or luminosity of the sample. Typically, the data for a pixel comprises a value representing the intensities of a plurality of component or primary colors of the sample. The image can be reconstructed for viewing by "inverting" the quantized discrete sample values to produce a plurality of colored dots mapped to coordinates corresponding to the pixel locations in the original image.

While representing an image as an array of discrete pixel values is useful for image processing, the quantity of raw data required to represent an image is formidable. For example, a VHS based video display comprises a 320×480 rectangular array of pixels and a high definition television (HDTV) image comprises a 1360×1024 pixel array. If each color image pixel is represented by three bytes (8 bit color), approximately one-half megabyte (MB) is required to represent a single VHS based image and approximately four MBs is required for an HDTV image. A full length movie at VHS resolution would require approximately 100 gigabytes (GB) of data, far in excess of the seventeen GBs maximum capacity of a digital video disk (DVD). If digital image data were not compressed before storage or transmission, such large quantities of data would make digital video impractical for most applications.

Video compression standards and related compression techniques have been developed to reduce the quantities of data necessary for digital video to levels that make storage and transmission practical. These standards include the MPEG family of standards promulgated by Motion Picture Experts Group standards (e.g., (MPEG-2—video) ISO-13818-2, GENERIC CODING OF MOVING PICTURES AND ASSOCIATED AUDIO, International Standards Organization) and the H.26X family of standards developed or under development by the International Telecommunications Union (ITU) (e.g., ITU-T RECOMMENDATION 263, VERSION 2, Telecommunications Standardization Sector, International Telecommunications Union). Typically, the digital video compression techniques exploit similarities between pixels within an image, referred to as spatial or intraframe correlation, and similarities between successive video frames, referred to as temporal or interframe correlation, to compress the raw data describing the pixels of a video sequence.

A digital video compression system comprises an encoder for compressing the raw video data and a decoder (collectively, a codec) to reverse the encoding process and reconstruct the images in the video frames for display. Referring to FIG. 1, a digital video encoder 20 typically comprises some form of differential pulse code modulation (DPCM) encoder 22 (indicated by a bracket) that converts the data representing the pixels of a sequence of video frames 24 to a syntactical bitstream 23 of quantized transform coefficients 26 representing intracoded frames and differential frame content of intercoded frames, motion vectors 28 describing the displacement of content in interframe coded frames, and mode data 30 or instructions to the decoder concerning the nature of the data included in the bitstream 23.

The output 23 of the DPCM encoder 22 is typically input to an entropy encoder 32 that applies one or more lossless compression processes to further compress the bitstream before it is stored or transmitted to a decoder 34. The objective of entropy encoding is to reduce the symbols of the bit stream to only the minimum required to convey the information content of the bit stream. The entropy of a symbol in a source is a function of the probability of the symbol:

$$E_i = -\log_2 p_i$$

where:

$E_i$=the entropy of the symbol i $p_i$=the probability that the symbol i will occur in the source Entropy coding comprises modeling a bitstream to determine the probabilities of each possible symbol value and substitution of a codeword for a bit stream symbol according to the probability of the symbol in the model. The effectiveness of entropy coding in further compressing the bitstream is intimately connected to the probabilistic similarity between the bitstream output by the DPCM coder 22, which varies for each video sequence, and the model bitstream utilized in the design of the entropy code. Entropy coding includes processes such as run length coding where sequences or runs of repeating symbols are replaced by a number indicating the number of repetitions in the run, variable length coding, and arithmetic coding.

One of the most common entropy coding techniques for video coding purposes is variable length coding. In variable length coding, compression is achieved by assigning shorter codewords (i.e., short sequences of bits) to bit stream symbols with higher probabilities of occurrence and longer codewords to symbols with lesser probabilities. The codewords and associated symbols are typically organized in a look up table or code book for use by the decoder. If the average codeword length is less than the average symbol length, the bitstream will have been compressed. The simplest form of variable length coding utilizes a static code in which a single code is used to code the symbols of a particular bitstream syntax. While static variable length codes have the advantage of simplicity and may be implemented with custom circuitry for rapid coding and decoding, the effectiveness of a static code suffers when the probability distribution of symbols in the bitstream being coded differs from the probability distribution in the model bitstream on which the design of the code is based. Adaptive variable length coding models the code to the probability statistics of the specific bitstream being compressed and provides good compression performance over a range of source data, but is more complex than static variable length coding since both the encoder and the decoder must track the changes in the variable length code as it adapts to changing bitstream probabilities. However, the efficiency of variable length coding, either static or adaptive, in compressing a bitstream is limited by the nature of the coding process. The optimal length of a variable length codeword equals the entropy of the coded symbol. If a symbol has a probability exceeding 0.5, the optimal length of the codeword is less than one bit. However, variable length codewords must include an integral number of bits. Since a high probability symbol will be inefficiently coded by variable length coding, a bit stream that includes the symbol will be either inefficiently compressed or even expanded.

Arithmetic coding provides an alternative to variable length coding. With this method it is possible to exactly represent the probabilities for symbols in the model bitstream with the result that performance does not suffer when the bitstream includes a frequently occurring symbol. An arithmetic coder is capable of achieving near optimal compression regardless of the probabilities of the symbols, but the performance of a static arithmetic coder still suffers when the bitstream statistics vary from those of the model bitstream on which the coder is based. An adaptive arithmetic coder can adapt the code to the statistics for the bitstream being coded, but this requires modeling several bit streams and updating the encoder and decoder as the arithmetic coder adapts to the changing statistics. However, arithmetic coders are more complex than variable length coders and have limited error robustness. A mismatch between the arithmetic coder and decoder caused by a single error renders the remaining data useless and adaptive coders must be frequently reset to avoid data loss.

What is desired, therefore, is a method of entropy coding that is easily implemented and provides good performance when applied to a bitstream that may include a symbol with a high probability of occurrence.

DETAILED DESCRIPTION OF THE INVENTION

Figure 1:
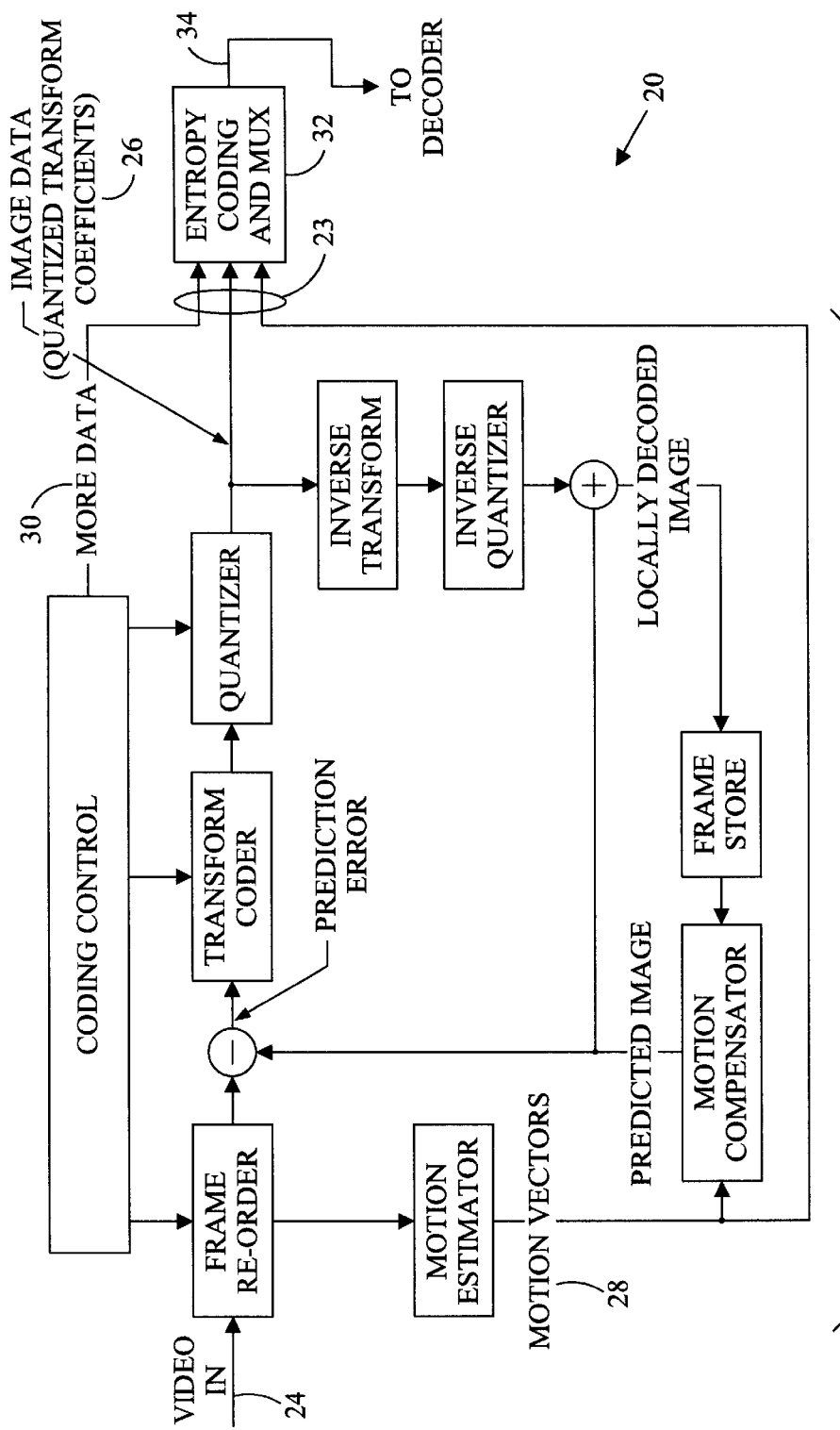
FIG. 1 is a block diagram of a digital video encoder.
Figure 2:
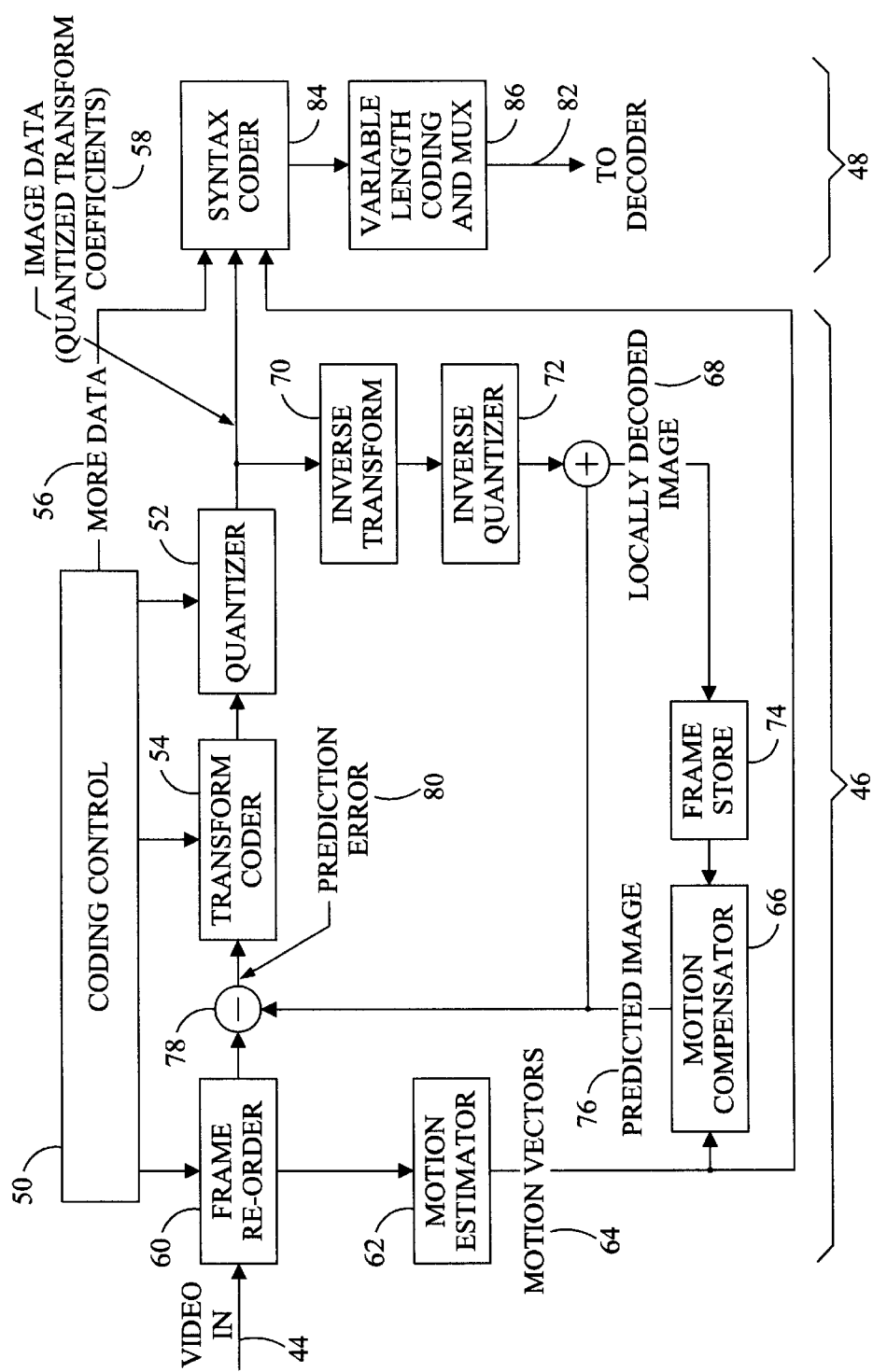
FIG. 2 is a block diagram of a digital video encoder including a syntax coder.
Figure 3:
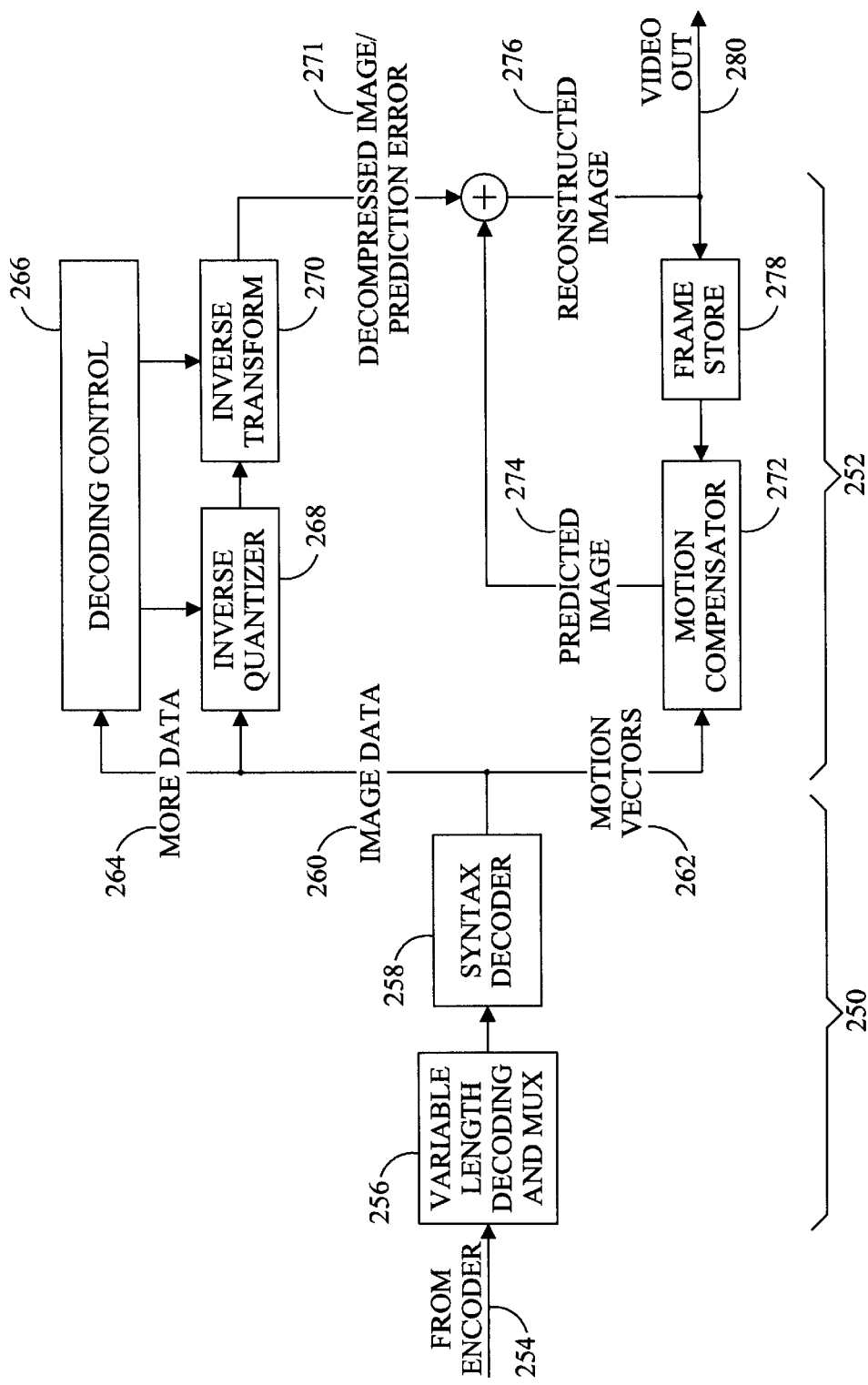
FIG. 3 is a block diagram of a digital video decoder including a syntax decoder.

Referring to FIGS. 2 and 3, a digital video compression system (codec) comprises, generally, an encoder 40 for compressing the video data for storage or transmission and a decoder 42 to reverse the encoding process and reconstruct the succession of images for display. The raw video input 44 comprising the digital equivalent of the intensities of pixels obtained by sampling the images in the successive frames of a video sequence are input to the encoder 40. To achieve the necessary data compression, video compression techniques commonly include a lossy compression process applied by a differential pulse code modulation (DPCM) coder 46 (indicated by a bracket) followed by one or more lossless entropy coding processes applied by an entropy coder 48 (indicated by a bracket).

The lossy compression processes applied by the DPCM coder 48 typically exploit similarities between pixels of an image (intraframe correlation) to compress the image data for a plurality of intraframe coded reference frames and similarities between successive frames (interframe correlation) to identify the differences between a frame and a reference frame so that only the differences need be stored and transmitted for a plurality of interframe coded frames. A coding control unit 50 determines whether a frame of the video will be intraframe coded or interframe coded, sets a flag included in mode data 52 to indicate the frame coding method to the decoder 42, and directs reordering of the frames as required by the coding technique in use.

Figure 4:
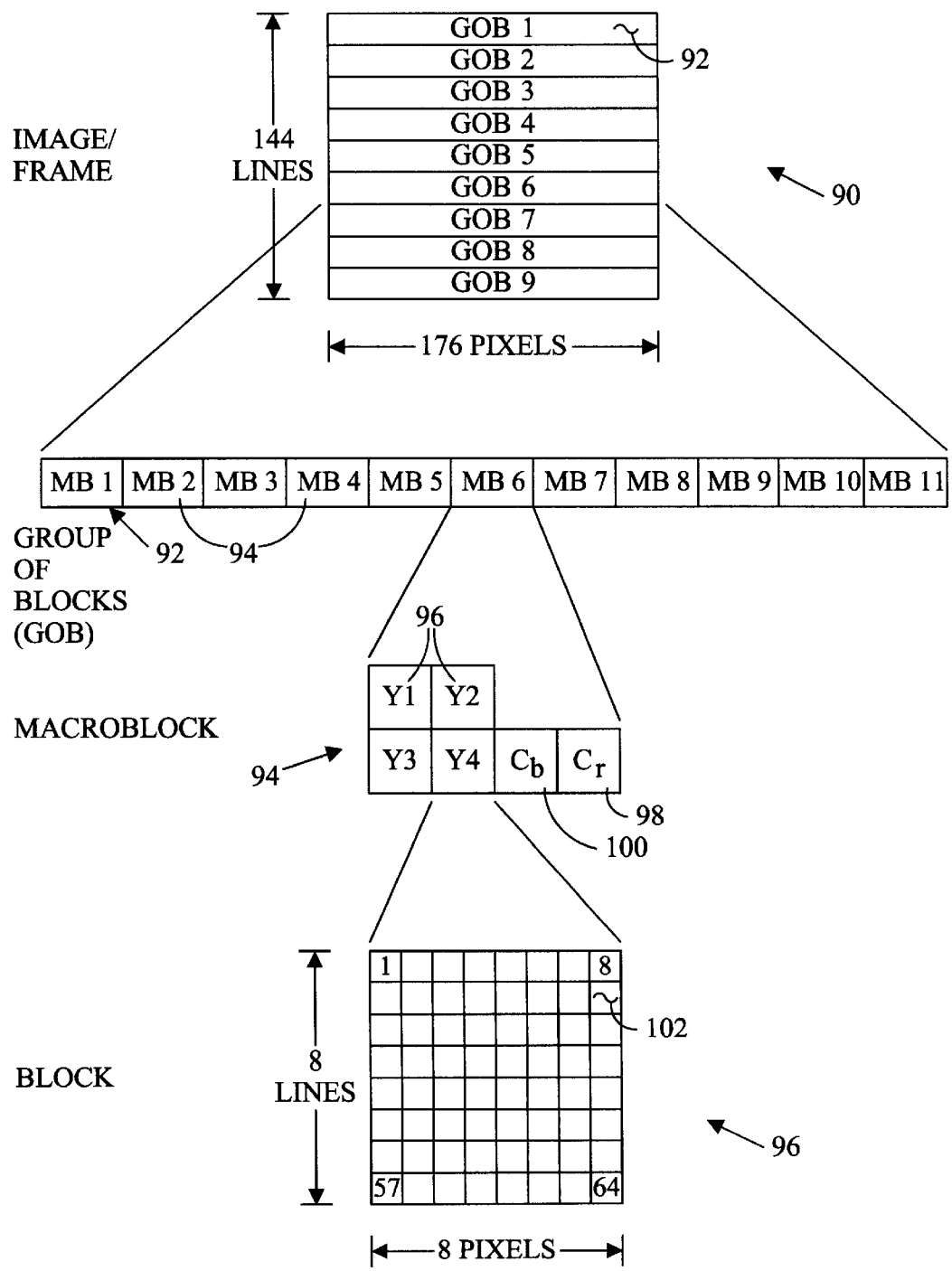
FIG. 4 illustrates the elements of an image in the QCIF image format.

The intraframe compression process is commonly a lossy process in which the spatial domain pixel data is converted or transformed to another domain (typically, the frequency domain) by a transform coder 54 to make it easier to identify data that is likely to be irrelevant to human viewers and, therefore, can be discarded. Several different transformation methods have been proposed for use and are used in digital video processing. One common method is block-based transformation in which the pixels of the image are divided into a plurality of non-overlapping pixel blocks and a transformation algorithm is applied to the signal representing the changing intensities of the pixels in each block. Compression standards typically support a plurality of image or picture formats that define a hierarchy of image elements. For example, the DRAFT RECOMMENDATION H.26L: VIDEO CODEC FOR LOW BITRATE COMMUNICATIONS, International Telecommunications Union, supports five source formats including the QCIF format illustrated in FIG. 4. A QCIF formatted image 90 comprises a rectangular array of 144 lines of 176 pixels. The array is subdivided into nine horizontal scans or groups of blocks (GOB) 92, each comprising 16 lines of pixels. Each GOB 92 comprises eleven macroblocks 94 which, in turn, comprise a plurality of pixel blocks. For the purpose of transformation of the luminance of the image pixels, a QCIF macroblock 94 comprises four 8 pixel×8 pixel blocks 96. A pair of chrominance values for the macroblock 94 are determined from subsampled blocks of pixels 98 and 100 that spatially correspond to area to the four luminance blocks.

One commonly used block-based transformation algorithm is the Discrete Cosine Transform (DCT). The DCT is a reversible transform that converts the spatial domain signal produced by the changing intensities of the pixels 102 of a block to a block of transform coefficients representing the contributions of component intensity variations of various frequencies to the spatial changes in intensity within the block. Lower frequency components represent slow changes of intensity and higher frequency components represent the rapid changes in intensity that characterize object edges and image details. Since a single color characteristically predominates in a small area of an image, the transform coefficients for higher frequency components tend to be small. On the other hand, many image details are visually irrelevant for digital video so low intensity, high frequency components characterized by small transform coefficients can be discarded without visually objectionable distortion of the video.

The blocks of transform coefficients produced by the transform coder 54 are scanned in a zigzag pattern capturing an arrangement of the transform coefficients in an order of generally increasing frequency. The scanned transform coefficients are then quantized by a quantizer 56. Quantization is a "rounding off" operation where all transform coefficients output by the transform coder 54 having a value within one of plurality of value sub-ranges are mapped to a single value or quantization index or level. The extents of the value sub-ranges are established by a quantization parameter that is determined by the coding control unit 50 and is typically adjustable to control the bit rate output by the encoder 40. Since transform coefficients representing high frequency components tend to be small, many are rounded off to zero during quantization, effectively discarding the information representing details in the image but distorting the image when it is reconstructed for display. The quantization indices (quantized transform coefficients) or image data 58 output by the quantizer 56 comprise the data describing the image content of intraframe coded video frames or the differential content of an interframe-coded frame. The quantization parameter is included in the mode data 52 and sent with the quantization indices to the decoder 42 to permit an inverse quantizer in the decoder to reconstruct the transform coefficients.

A substantial part of the data reduction for compressed video is obtained by motion compensated, predictive interframe coding of certain frames of the video input 44. The data representing the pixels of a current frame are transferred from the frame reorder unit 60 to a motion estimator 62 where blocks of pixels in the current frame are compared to the pixels of a reference frame to identify the best matching block of pixels. If a suitable matching block of pixels is identified, a motion vector 64 indicating the displacement of the block of pixels between the two frames is generated and input to a motion compensator 66 and output by the DPCM coder 46.

The encoder 40 inherently includes a decoder to reconstruct a locally decoded reference frame image 68 by inverse quantizing 70 and inverse transforming 72 the image data 58. In the motion compensator 66 the locally decoded image 68 obtained from the frame store 74 is combined with the motion vectors 64 produced by the motion estimator 62 to produce a predicted image 76. The predicted image 76 is subtracted 78 from the current frame image to identify a prediction error 80 or the difference in content between the predicted frame and the current frame. The prediction error 80 is transform coded 54 and quantized 56 and output by the DPCM coder 46 for entropy coding and ultimate transmission to a decoder 82 along with the motion vectors 64 describing the displacement of blocks of pixels having matching blocks in the reference frame.

Figure 5:
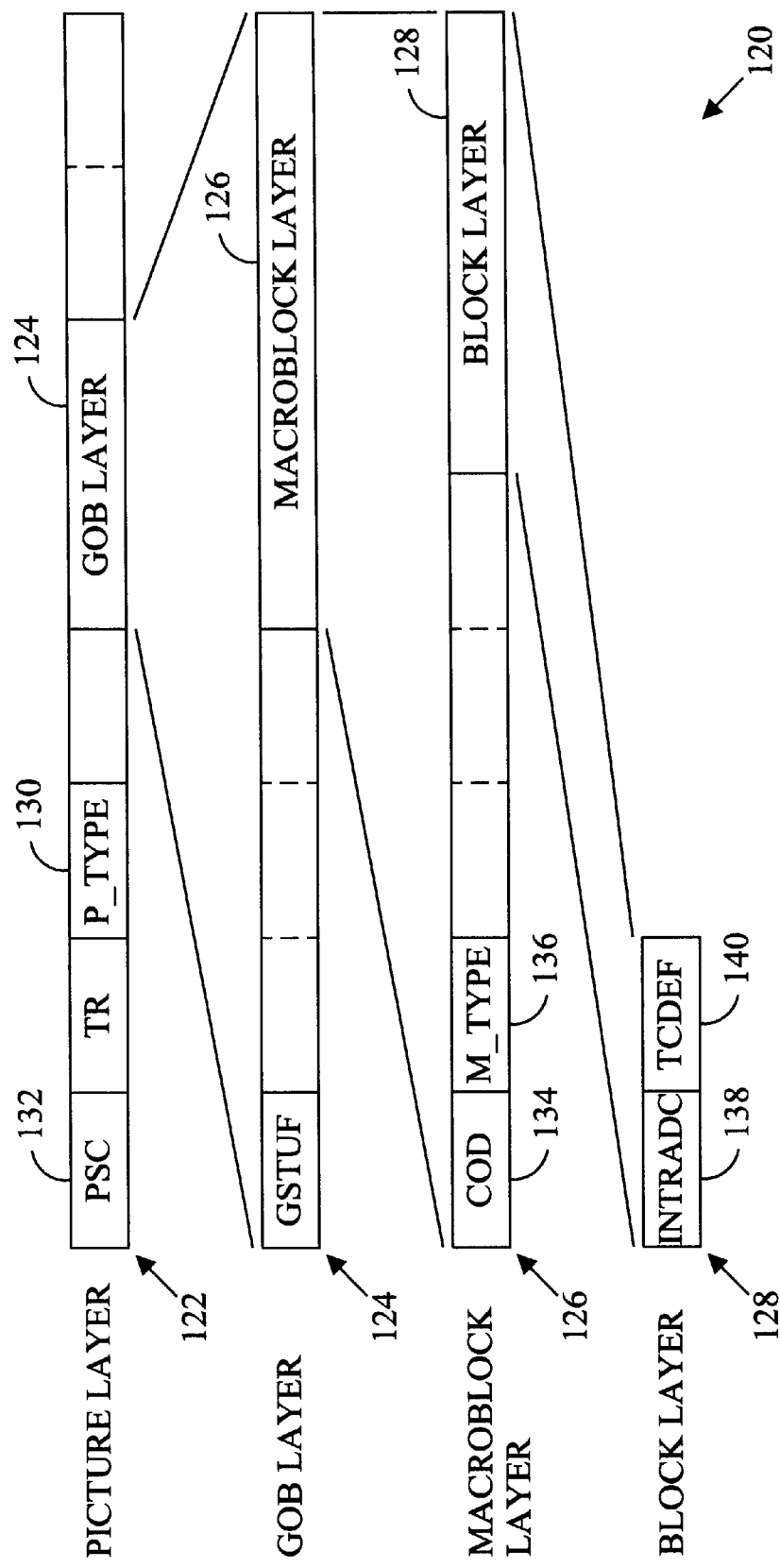
FIG. 5 is a schematic diagram of the data elements of a layered bit stream.

The quantized transform coefficients (image data 58), motion vectors 64, and mode data 52, including quantizer data and frame coding method flags, are combined in a bitstream according to a syntax specified for the compression technique and input to the entropy coder 48. Referring to FIG. 5, video coding bit streams output by the DPCM coder 46 commonly employ a layered syntax for plurality of data elements. The layers of the bit stream 120 typically reflect the image formatting elements including a picture (image) layer 122, a GOB layer 124, a macroblock layer 126 and a block layer 128. Each layer of the bit stream encapsulates and specifies parameters common to the elements of the next lower layer. For example, the picture layer 122 typically a picture type data element (P_Type) 130 that typically includes data related to several different image formatting elements including the source format of the image (e.g., QCIF) which determines the number and makeup of the encoded GOB, macroblocks, and blocks and the coding type (e.g., interceded from the last decoded frame, intercoded from an earlier frame, or intracoded). The picture layer 122 also typically includes data elements that specify a picture start code 132, a temporal reference 134, an initial quantization step size, and the end of the data for the picture. Likewise, the GOB layer 124 (which may be optional) specifies certain data common to the macroblocks making up the GOB.

The macroblock layer 126 comprises data elements describing the characteristics of the individual macroblocks. According to ITU-T Recommendation, H.263, the data elements for each macroblock include a coded macroblock indication (COD) 134 indicating whether the macroblock is coded or whether the decoder is to treat the macroblock as interframe coded with a motion vector of zero, quantizer information indicating a change in the quantizer step size for the macroblock, motion vector data indicating the displacement of the macroblock between the current frame and its corresponding reference frame (if applicable) and a macroblock type 136. Typically, compression techniques support several macroblock types 136 comprising differing arrangements of sub-blocks of pixels and differing numbers of motion vectors to describe displacement of the sub-blocks. The image data, comprising the DC transform coefficient for intracoded blocks (INTADC) 138 and the transform coefficient 140 describing the content of intracoded frames and prediction error for intercoded frames is typically included in the block layer.

The effectiveness of variable length entropy coding suffers if a symbol has a high probability of occurrence in the bit stream. If the probability of occurrence of a symbol exceeds 0.5, the entropy of the symbol and the optimum length of its corresponding codeword is less than one bit. However, each codeword resulting from variable length coding must include an integral number of bits. Symbols such as those representing the COD and macroblock type data elements that are included in the header for each macroblock (e.g., 99 macroblock headers for a QCIF image) and are likely to be the same for most macroblocks of the image are examples of symbols with a high probability of occurrence and are often inefficiently coded with variable length coding. The inefficiency of variable length coding when coding a bitstream including symbols with a high probability of occurrence is inherent in the coding method. Arithmetic coding can be used to more efficiently compress bit streams containing high probability symbols but is more complicated than variable length coding and less tolerant of errors. The present inventors concluded, however, that when the bitstream includes symbols with a high probability of occurrence, the advantages of variable length coding can be maintained and the coding efficiency improved by altering the syntax of the bitstream input to the variable length coder to replace the high probability symbol with a symbol of lower probability.

Figure 6:
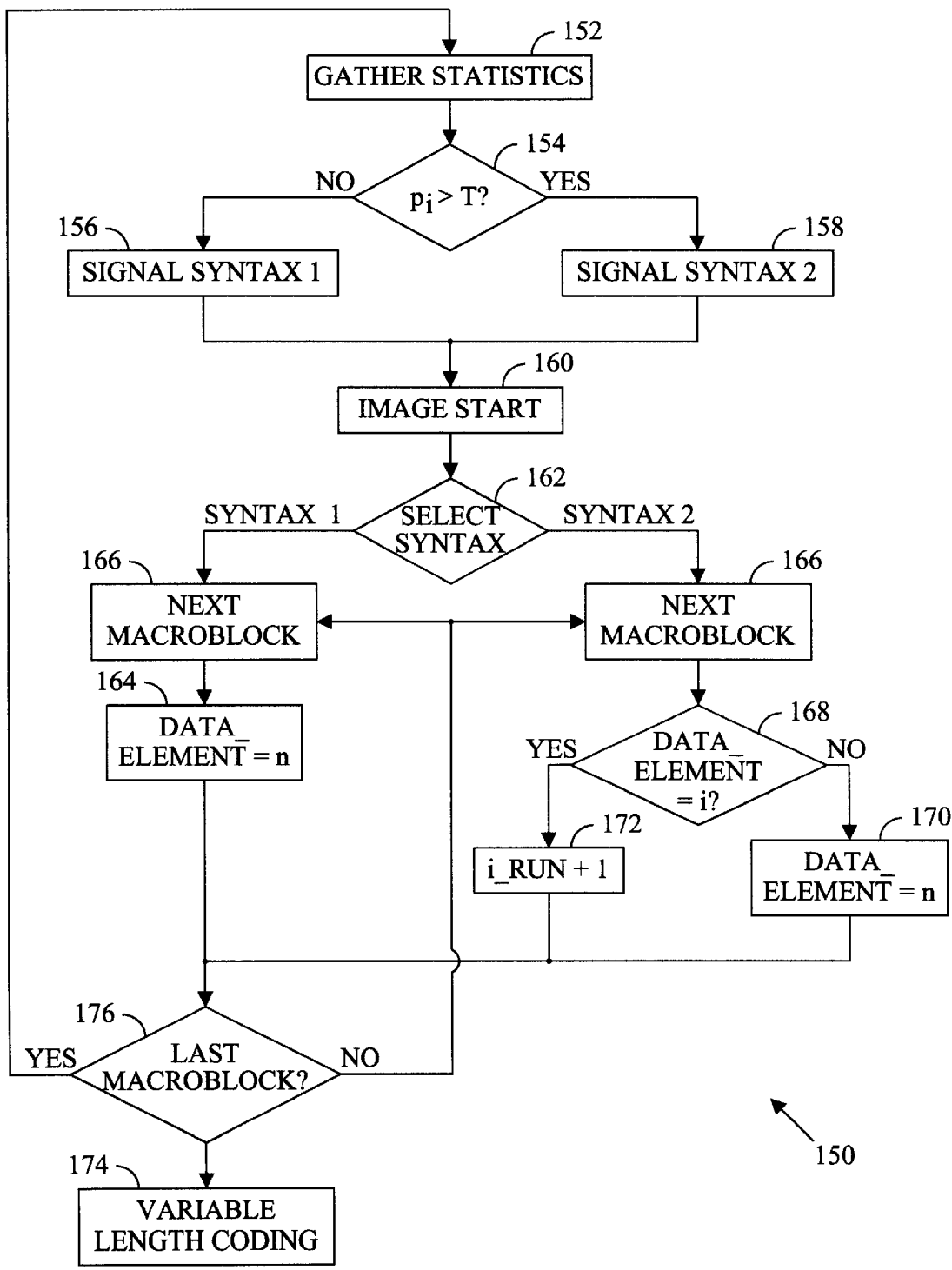
FIG. 6 is a flow diagram of a syntax coding method.

Referring to FIGS. 2 and 6, in the video encoder 40, a syntax coder 84 applies the adaptive syntax coding method 150 to revise the syntax of the bit stream output by the DPCM coder 46 before the bitstream is variable length coded by the variable length coder 86. In the adaptive syntax coding method 150 a symbol with a high probability of occurrence in the bit stream is replaced by a symbol with a lower probability of occurrence so that the efficiency of the variable length coding is maintained.

The identification of a symbol with a high probability of occurrence is determined from statistics obtained by analyzing a model bit stream 152. The model bitstream can be obtained pre-examining the data for the current video frame or from data related to a prior frame. If no symbol in the bitstream has a probability exceeding a threshold probability 154, the coder selects a first syntax 156 for the bit stream. If the encoder detects a symbol (i) having a probability exceeding the threshold ($p_i$>T?) 154 and, therefore likely to adversely affect variable length coding efficiency, the encoder selects a second syntax 158. The selected syntax applicable to an image is signaled by one bit at the beginning of the image.

Following selection of the syntax for the image bitstream, the data for the image is processed 160. The coder reads the syntax signaled for the image and processes the bitstream according to the selected syntax 162. If the bit stream does not include a frequently occurring symbol, a syntax adapted for bit streams with low symbol probability would be applied and the appropriate symbol (n) would be inserted in the bit stream at the location for the corresponding data element 164. For example, as described in the H.263 recommendation, the data for each macroblock includes a macroblock type (M_Type). If the symbol for the macroblock type is not a high probability symbol in the model bitstream, the syntax coder 84 would adapt syntax 1 (156) and output the appropriate macroblock type in each macroblock header as specified by the H.263 bit stream syntax.

On the other hand, if the coder detects a symbol (i) with a high probability of occurrence in the model bitstream 154, a second syntax 158 is applied. For example, it is likely that most of the macroblocks of an image will of one type (e.g., type A) and therefore be represented by a frequently occurring symbol (i) in the bitstream input to the entropy coder 48. A second syntax compiling lengths of runs of this symbol for the macroblock type can be used to replace the high probability symbol (i) with a lower probability symbol, the run length. As each macroblock is processed 166, the method checks whether the symbol for the data element is the high probability symbol (e.g., Data_Element=i?) 168. If not, the symbol obtained from the input bit stream (n) is inserted into the bit stream for the data element (e.g., M-Type) as in the application of the first syntax coding method 170. If the high probability symbol does occur in the macroblock, a symbol run length counter (i_RUN) is incremented 172 and the run length is inserted for the data element in the bit stream. As a result, frequent occurrences of an inefficiently coded high probability symbol in the bitstream are replaced with data indicating the number of successive data elements (e.g., macroblocks) to which this symbol applies and the efficiency of variable length coding 174 is maintained.

The method applies the selected syntax to each occurrence of the data element in the bit stream and the bit stream is variable length coded 174 by substituting codewords for the bit stream symbols as a function of the probability of the symbol in the bit stream. The method continues for each macroblock of the image, until the last macroblock of the image is processed 176. If the current macroblock is the last macroblock 176, the method initiates the adaptive syntax method for the next image. Otherwise, the method proceeds to the next macroblock 166.

The entropy coded bit stream is typically transmitted to a decoder for decoding or stored for later decoding 82. Referring again to FIG. 3, the decoder 42, comprising generally an entropy decoder 250 (indicated by a bracket) and a DPCM decoder 252 (indicated by a bracket), reverses the processes of the encoder to convert the code symbols of the compressed bitstream # to pixels # of an image for display to a viewer. The look up table or code book generated during variable length coding and associating codewords in the compressed bit stream and appropriate bitstream symbols is recovered from the compressed bitstream 254 and used by the variable length decoder 256 to decode the symbols of the bitstream.

Figure 7:
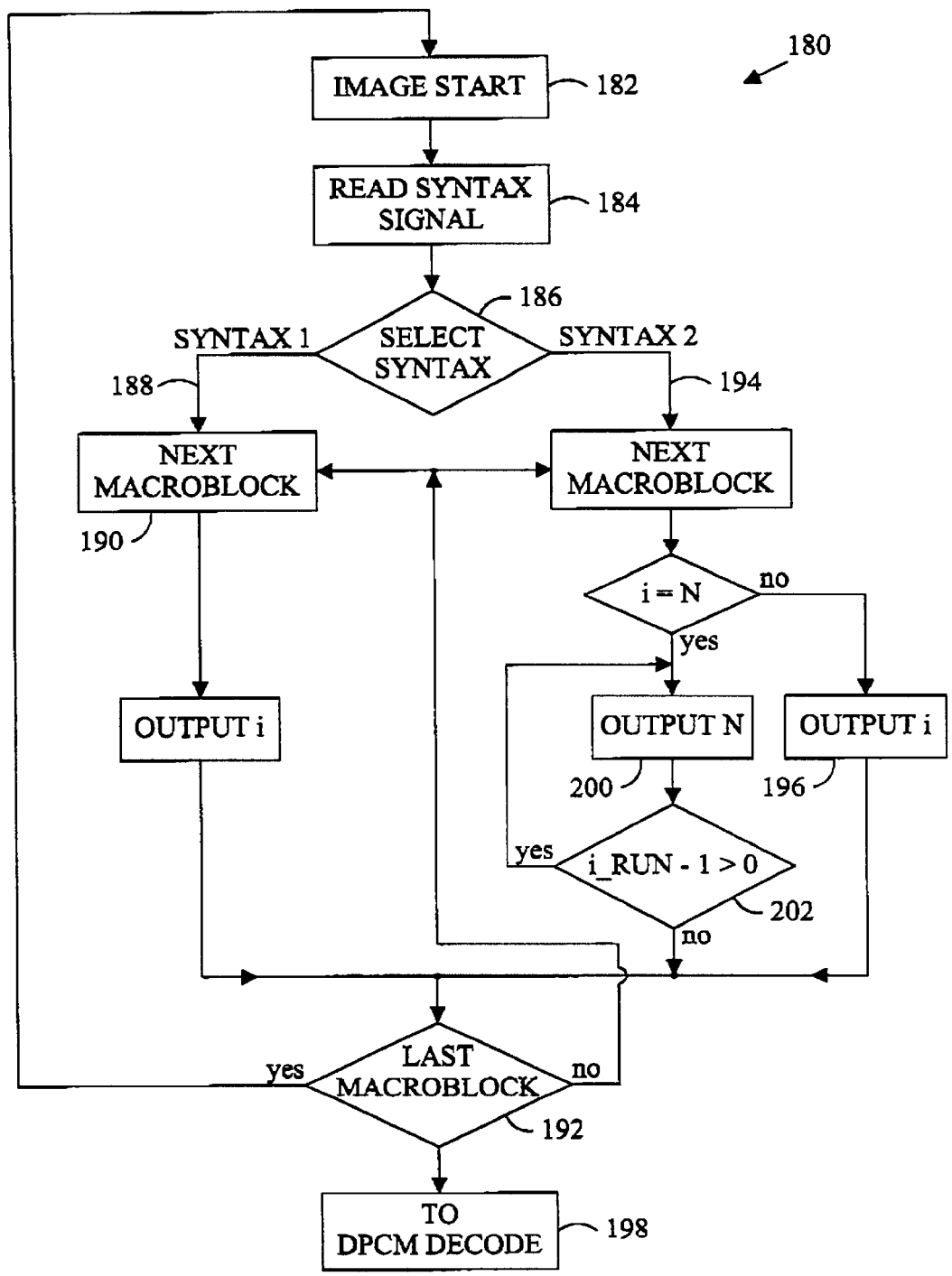
FIG. 7 is a flow diagram of a syntax decoding method.

The decoded bit stream is input to a syntax decoder 258 that alters the syntax of the bit stream from the variable length decoder 256, if required, to a bit stream with a syntax matching the bit stream output by the DPCM coder 46 of the encoder 40 so that the image data 260, motion vectors 262, and mode data 264 can be recovered. Referring to FIG. 7, in the syntax decoding method 180, the start of the image data is detected 182 in the bitstream output by the variable length decoder 256. The syntax applicable to the portion of the bit stream representing the image is determined by detecting the syntax signal in the bit stream 184 and the decoder switches to the syntax decoding method to be applied to the data 186. If the first syntax method (syntax 1) was applied during coding, the decoding method outputs the symbols (n) describing the data elements (e.g., M_Type for the macroblock) that are acquired from the bit stream 188. The macroblocks are processed successively 190 and the data is input to the DPCM decoder 252 until the last macroblock of the image is decoded 192. On the other hand, if the syntax signaled for the image is the high probability symbol syntax (syntax 2), the decoder detects whether the data element in the bit stream includes a symbol other than the high probability symbol (e.g., Data_Element=i?) 194. If the symbol for the data element is not the high probability symbol (i), the symbol (n) is passed to the bit stream 196 being input to the DPCM decoding 198. If the symbol in the header is the high probability symbol (e.g., Data_Element=i?) 194, the high probability symbol is inserted in the output bit stream 200 for the data element and the run length of high probability symbols is decremented 202. Data elements for succeeding macroblocks 190 are assigned the high probability symbol 200 until the run of macroblocks is exhausted (i_Run−1=0) 202. The process continues until the last macroblock is decoded 192 and decoding the next image 182 is initiated.

The quantization parameter is recovered from mode data 264 and input by the decoder control 266 to the inverse quantizer 268. The transform coefficients output by the inverse quantizer 268 are processed by the inverse transformer 270 to obtain the pixels of the decompressed image and prediction error for interceded frames 271. The motion vectors 262 are recovered from the bitstream output by the syntax decoder 258 and input to a motion compensator 272. A predicted image 274 is generated from the combination of the reconstructed reference image 276 obtained from the frame store 278 and the motion vectors 262. The decompressed prediction error 271 is added to the predicted image 274 to produce the intercoded frames and reconstructed intracoded and intercoded frames 276 are displayed in order to produce the output video 280.

The efficiency of variable length entropy coding is limited by the inability to efficiently code high probability symbols in a bit stream. Adaptive syntax coding of the compressed bitstream replaces a high probability symbol with a symbol of lower probability to maintain the efficiency of variable length coding and avoid the need to adopt more complex arithmetic coding.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method of processing a bit stream comprising a plurality of symbols, said method comprising:
   (a) determining a probability of occurrence of a symbol in a model bit stream; and
   (b) replacing a high probability symbol in said bit stream with a symbol of lower probability if said probability of occurrence of said high probability symbol in said model bit stream exceeds a threshold.

2. The method of claim 1 wherein said model bit stream comprises the symbols of said bit stream.

3. The method of claim 1 wherein said symbol of lower probability comprises a number of repetitions of said high probability symbol.

4. An entropy coding method comprising the steps of:
   (a) determining a probability of occurrence of a symbol in a model bit stream;
   (b) replacing a high probability symbol with a lower probability symbol if said probability of occurrence exceeds a threshold; and
   (c) replacing said lower probability symbol with a codeword.

5. The method of claim 1 wherein said lower probability symbol comprises a number of repetitions of a said high probability symbol.

6. The method of claim 4 wherein the step of determining a probability of occurrence of a symbol in a model bit stream comprises the step of compiling statistics relating an occurrence of symbols in said model bit stream.

7. The method of claim 6 wherein said model bit stream comprises the symbols of said bit stream.

8. The method of claim 4 wherein the step of replacing said lower probability symbol with a codeword comprises the steps of:
   (a) determining a probability of occurrence of symbols in a model bit stream; and
   (b) assigning a codeword to a symbol of said bit stream, said codeword comprising a number of symbols having a relationship to said probability of occurrence.

9. A method of decoding a bit stream comprising a plurality of codewords, said method comprising the steps of:
   (a) substituting a symbol for a codeword of said bit stream according to a code book relating said codeword and said symbol;
   (b) identifying a syntax for said bit stream; and
   (c) replacing said symbol of said bit stream with a new symbol if required by said syntax.

10. The method of claim 9 wherein the step of replacing a symbol of said bit stream with a new symbol comprises the steps of:
    (a) detecting said symbol in said bit stream; and
    (b) substituting said new symbol for said symbol if a number of occurrence of said symbol is less than a run length of said symbols specified in said bit stream.

11. An entropy coder for a plurality of symbols of a syntactical bit stream, said entropy encoder comprising:
    (a) a syntax coder to alter said syntax of said bit stream if a symbol has a high probability of occurrence in said bit stream; and
    (b) a variable length coder to replace a symbol of said bit stream output by said syntax coder with a codeword.

12. A method of processing a bit stream comprising a plurality of symbols, said method comprising:
    (a) determining a probability of occurrence of a symbol in a model bit stream;
    (b) replacing a high probability symbol in said bit stream with a symbol of lower probability if said probability of occurrence of said high probability symbol in said model bit stream exceeds a threshold; and
    (c) wherein said symbol of lower probability comprises a number of repetitions of said high probability symbol.

13. An entropy coding method comprising the steps of:
    (a) determining a probability of occurrence of a symbol in a model bit stream;
    (b) replacing a high probability symbol with a lower probability symbol if said probability of occurrence exceeds a threshold;
    (c) replacing said lower probability symbol with a codeword; and
    (d) wherein the step of determining a probability of occurrence of a symbol in a model bit stream comprises the step of compiling statistics relating an occurrence of symbols in said model bit stream.

14. The method of claim 13 wherein said model bit stream comprises the symbols of said bit stream.

15. An entropy coding method comprising the steps of:
    (a) determining a probability of occurrence of a symbol in a model bit stream;
    (b) wherein the step of determining a probability of occurrence of a symbol in a model bit stream comprises the step of compiling statistics relating an occurrence of symbols in said model bit stream;
    (c) replacing said lower probability symbol with a codeword;
    (d) wherein the step of determining a probability of occurrence of a symbol in a model bit stream comprises the step of compiling statistics relating an occurrence of symbols in said model bit stream; and
    (e) wherein the step of replacing said lower probability symbol with a codeword comprises the steps of:
        (i) determining a probability of occurrence of symbols in a model bit stream; and
        (ii) assigning a codeword to a symbol of said bit stream, said codeword comprising a number of symbols having a relationship to said probability of occurrence.

16. A method of decoding a bit stream comprising a plurality of codewords, said method comprising the steps of:
    (a) substituting a symbol for a codeword of said bit stream according to a code book relating said codeword and said symbol;
    (b) identifying a syntax for said bit stream;
    (c) replacing a symbol of said bit stream with a new symbol if required by said syntax; and
    (d) wherein the step of replacing a symbol of said bit stream with a new symbol further comprises the steps of:
        (i) detecting said symbol in said bit stream; and
        (ii) substituting said new symbol for said symbol if a number of occurrence of said symbol is less than a run length of said symbols specified in said bit stream.

* * * * *

UNITED STATES PATENT AND TRADEMARK OFFICE
CERTIFICATE OF CORRECTION

PATENT NO. : 6,677,868 B2
DATED : January 13, 2004
INVENTOR(S) : Louis Kerofsky and Shijun Sun It is certified that error appears in the above-identified patent and that said Letters Patent is hereby corrected as shown below:

Column 1,
Line 57, change "263" to read -- H.263 --.

Column 5,
Line 63, change "interceded" to read -- intercoded --.

Signed and Sealed this

Thirteenth Day of September, 2005

JON W. DUDAS
*Director of the United States Patent and Trademark Office*